United States Patent
Kobayashi

(10) Patent No.: US 8,885,080 B2
(45) Date of Patent: *Nov. 11, 2014

(54) IMAGE PICKUP DEVICE AND IMAGE PICKUP RESULT OUTPUTTING METHOD

(75) Inventor: Seiji Kobayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 16 days.

This patent is subject to a terminal disclaimer.

(21) Appl. No.: 13/405,420

(22) Filed: Feb. 27, 2012

(65) Prior Publication Data

US 2012/0154624 A1 Jun. 21, 2012

Related U.S. Application Data

(63) Continuation of application No. 11/660,928, filed as application No. PCT/JP2005/015301 on Aug. 17, 2005, now Pat. No. 8,144,227.

(30) Foreign Application Priority Data

Feb. 9, 2004 (JP) ................................. 2004-255747

(51) Int. Cl.
*H04N 5/335* (2011.01)
*H01L 27/146* (2006.01)
*H04N 5/374* (2011.01)
*H04N 5/3745* (2011.01)

(52) U.S. Cl.
CPC .......... *H04N 5/374* (2013.01); *H01L 27/14632* (2013.01); *H01L 27/14627* (2013.01); *H01L 27/14609* (2013.01); *H01L 27/14634* (2013.01); *H04N 5/37455* (2013.01); *H01L 27/14603* (2013.01); *H01L 27/14643* (2013.01)

USPC .......... 348/294; 348/222.1; 257/228; 257/444

(58) Field of Classification Search
USPC .............. 257/228, 444, 460; 348/222.1, 302, 348/308, 294

See application file for complete search history.

(56) References Cited

U.S. PATENT DOCUMENTS

| 4,529,965 | A |   | 7/1985 | Lee |
|---|---|---|---|---|
| 5,101,205 | A | * | 3/1992 | Yasuda .......................... 341/155 |
| 5,449,944 | A | * | 9/1995 | Sudo et al. ..................... 257/446 |
| 5,461,425 | A |   | 10/1995 | Fowler et al. |
| 5,734,427 | A | * | 3/1998 | Hayashi ................... 348/333.11 |

(Continued)

FOREIGN PATENT DOCUMENTS

| JP | 05-048460 | 2/1993 |
|---|---|---|
| JP | 11-205685 | 7/1999 |

(Continued)

OTHER PUBLICATIONS

H. Kurino et al.,"Intelligent Image Sensor Chip with Three Dimensional Structure," IEDM Technical Digest, IEEE, pp. 879-882 (1999).

*Primary Examiner* — Tuan Ho
*Assistant Examiner* — Mark Monk
(74) *Attorney, Agent, or Firm* — Finnegan, Henderson, Farabow, Garrett & Dunner, LLP

(57) ABSTRACT

The present invention is applied to an image pickup device with a CMOS solid-state image pickup element, in which an analog-to-digital conversion circuit is disposed in a surface on an opposite side from an image pickup surface in a semiconductor chip 2.

19 Claims, 15 Drawing Sheets

(56) References Cited

U.S. PATENT DOCUMENTS

| | | | |
|---|---|---|---|
| 5,777,900 A | | 7/1998 | Takeuchi et al. |
| 6,107,618 A | * | 8/2000 | Fossum et al. ............ 250/208.1 |
| 6,124,813 A | * | 9/2000 | Robertson et al. ............ 341/143 |
| 6,229,133 B1 | | 5/2001 | Hynecek |
| 6,449,014 B1 | * | 9/2002 | Throngnumchai ............ 348/308 |
| 6,701,027 B1 | * | 3/2004 | Ernst ............................ 382/275 |
| 2002/0130266 A1 | * | 9/2002 | Kyyhkynen ............ 250/370.09 |
| 2003/0169361 A1 | * | 9/2003 | Kandleinsberger et al. .. 348/335 |
| 2006/0023109 A1 | | 2/2006 | Mabuchi et al. |

FOREIGN PATENT DOCUMENTS

| | | |
|---|---|---|
| JP | 11-205695 | 7/1999 |
| JP | 2000-358198 | 12/2000 |
| JP | 2001-339057 | 12/2001 |
| JP | 2001-345700 | 12/2001 |
| JP | 2003-23573 | 1/2003 |
| JP | 2003-023573 | 1/2003 |
| JP | 2003-031785 | 1/2003 |
| JP | 2003-234967 | 8/2003 |
| JP | 2003-273343 | 9/2003 |
| JP | 2003-338615 | 11/2003 |

* cited by examiner

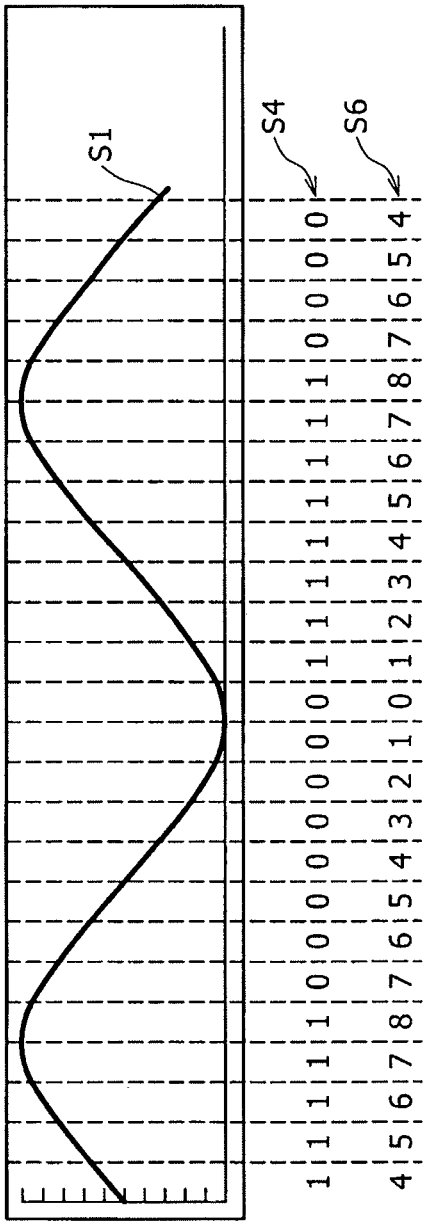
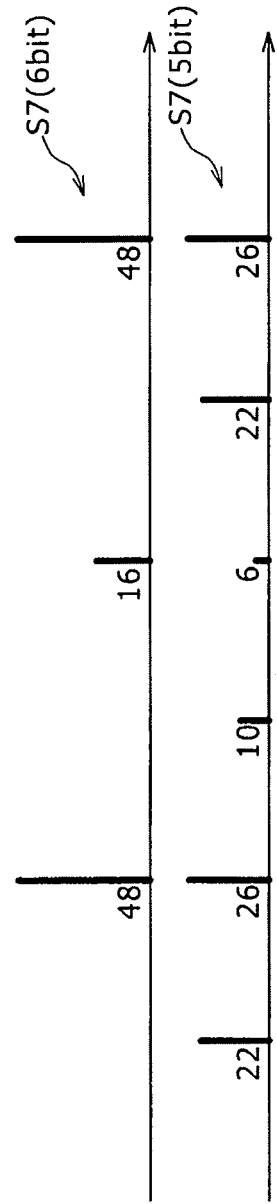
FIG.9A
FIG.9B
FIG.9C
FIG.9D
FIG.9E

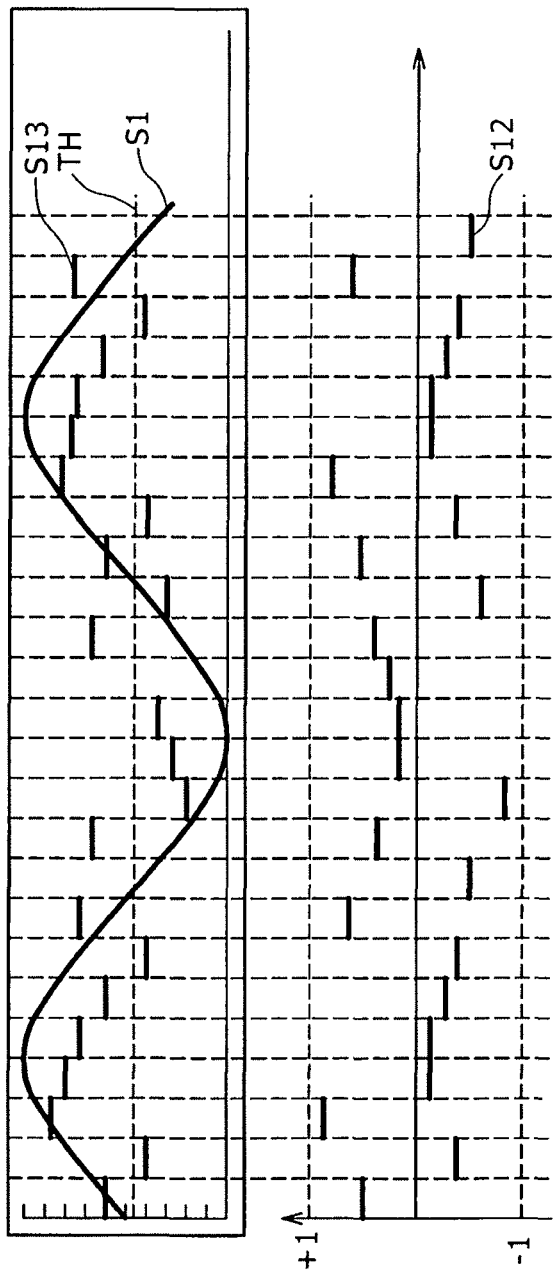

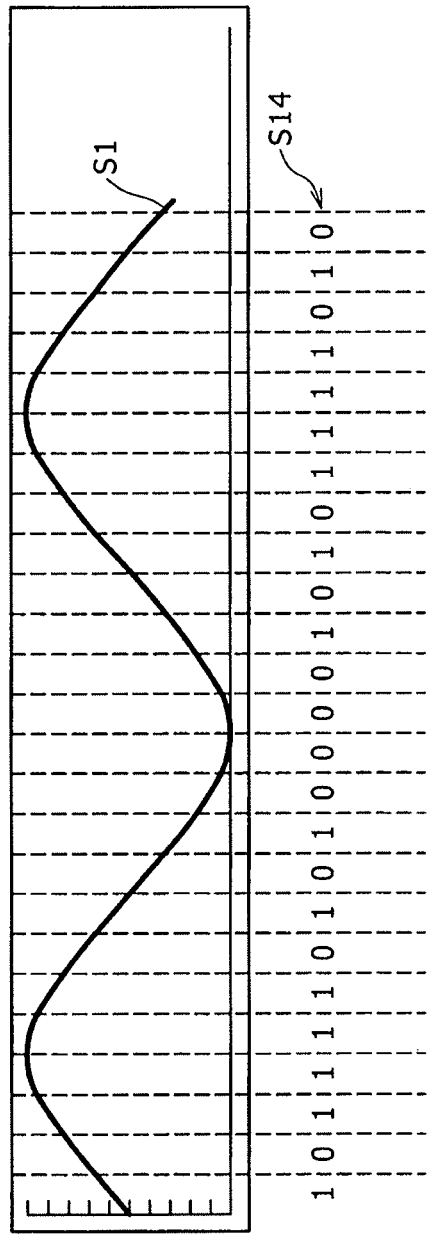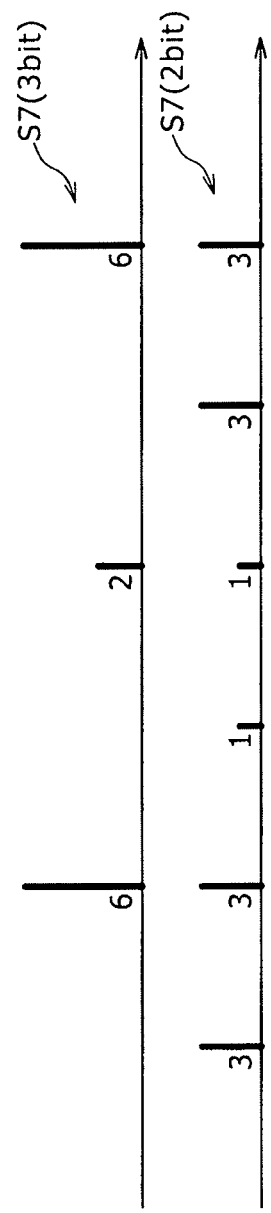
FIG.13A
FIG.13B
FIG.13C
FIG.13D

IMAGE PICKUP DEVICE AND IMAGE PICKUP RESULT OUTPUTTING METHOD

CROSS-REFERENCE TO RELATED APPLICATIONS

This is a continuation of U.S. patent application Ser. No. 11/660,928, filed Feb. 23, 2007 now U.S. Pat. No. 8,144,227, which is a national phase application of International Application No. PCT/JP2005/015301, filed Aug. 17, 2005, and claims the priority of Japanese Application No. 2004-255747, filed Sep. 2, 2004, the contents of all of the above-mentioned applications are incorporated herein by reference.

TECHNICAL FIELD

The present invention relates to an image pickup device and an image pickup result outputting method, and is applicable to an image pickup device with a CMOS solid-state image pickup element, for example. The present invention effectively avoids a decrease in aperture ratio in a configuration where an analog-to-digital conversion circuit is provided in an image pickup element by disposing the analog-to-digital conversion circuit in a surface on an opposite side from an image pickup surface in a semiconductor chip.

BACKGROUND ART

Conventionally, because a CMOS solid-state image pickup element can be formed integrally with various integrated circuits on a substrate, various configurations related to the integrations have been proposed.

Of these proposals, U.S. Pat. No. 5,461,425, for example, discloses a configuration in which a one-bit analog-to-digital conversion circuit based on delta sigma modulation is provided for each pixel. In this configuration, pixels arranged in the form of a two-dimensional array are selected in each row and connected to an output signal line. Image pickup results as one-bit digital signals are output from the output signal line, and converted into eight-bit image data by a filter. The thus obtained image data is output by one system via a multiplexer. Thus, the configuration disclosed in U.S. Pat. No. 5,461,425 scans pixels in row units, and outputs image pickup results.

In addition, U.S. Pat. No. 6,229,133 discloses a configuration in which an integration type one-bit analog-to-digital conversion circuit is provided for each pixel, an image pickup result of each pixel is subjected to frequency conversion, and then the result is output. In this configuration, while electric charge resulting from photoelectric conversion is accumulated in a capacitor, a terminal voltage of the capacitor is compared with a reference voltage. On the basis of a result of the comparison, the terminal voltage of the capacitor is initialized, and an output signal of logic 1 is output. Thereby, in this configuration, frequency of output of logic 1 is increased with increase in amount of light incident on each pixel, whereby an image pickup result of each pixel is subjected to frequency conversion. This output signal of logic 1 is processed by a filter, and then image data is output.

Such a configuration in which an analog-to-digital conversion circuit is provided for each pixel can correspondingly simplify the configuration of a peripheral circuit of an image pickup element.

However, the configuration in which an analog-to-digital conversion circuit is thus provided for each pixel has a problem in that the area of each pixel which area is occupied on the light receiving surface of the image pickup element is decreased and thus sensitivity is lowered due to a decrease in so-called aperture ratio. In order to remedy this, pixel area needs to be increased. However, because the area of a pixel cell including an analog-to-digital conversion circuit is increased, it becomes difficult to increase the number of pixels. In order to maintain the aperture ratio, it is necessary to create analog-to-digital conversion circuits at a high density, and it becomes correspondingly difficult to manufacture the image pickup element.

In addition, the configuration disclosed in U.S. Pat. No. 5,461,425 scans pixels in row units and outputs image pickup results. When the number of pixels is increased, it becomes difficult to increase a sampling rate. Further, because filter processing is performed with a predetermined number of taps in a filter unit, it is difficult to ensure a desired frame rate. With the configuration disclosed in U.S. Pat. No. 6,229,133, a storage time required for the reference voltage to be reached is lengthened when an amount of incident light is reduced. It is therefore difficult to increase the frame rate.

DISCLOSURE OF INVENTION

The present invention has been made in view of the above points, and an image pickup device and an image pickup result outputting method that make it possible to effectively avoid a decrease in aperture ratio in a configuration where an analog-to-digital conversion circuit is provided in an image pickup element are proposed.

In order to solve such problems, the present invention is applied to an image pickup device for outputting results of image pickup by a semiconductor chip in which pixels are arranged in a form of a matrix, wherein in one surface of the semiconductor chip, the pixels are arranged, and the results of image pickup of the pixels are output to another surface by XY address control, and in the other surface, analog-to-digital conversion circuits for subjecting the results of image pickup of the corresponding pixels to analog-to-digital conversion processing and outputting digital signals are formed in correspondence with the pixels.

With the configuration of the present invention applied to an image pickup device for outputting results of image pickup by a semiconductor chip in which pixels are arranged in a form of a matrix, in one surface of the semiconductor chip, the pixels are arranged, and the results of image pickup of the pixels are output to another surface by XY address control, and in the other surface, analog-to-digital conversion circuits for subjecting the results of image pickup of the corresponding pixels to analog-to-digital conversion processing and outputting digital signals are formed in correspondence with the pixels. Thus, wiring of the analog-to-digital conversion circuits is provided on the other surface. It is thereby possible to prevent a decrease in aperture ratio of each pixel due to the analog-to-digital conversion circuits.

In addition, the present invention is applied to an image pickup result outputting method for outputting results of image pickup by a semiconductor chip in which pixels are arranged in a form of a matrix, the image pickup result outputting method including: an image pickup result outputting step of outputting the results of image pickup of the pixels to another surface of the semiconductor chip by XY address control of the pixels arranged in one surface of the semiconductor chip; and an analog-to-digital conversion processing step of subjecting the results of image pickup of the pixels to analog-to-digital conversion processing and outputting digital signals by analog-to-digital conversion circuits arranged in correspondence with the pixels on the other surface.

Thus, with the constitution of the present invention, the image pickup result outputting method that makes it possible to effectively avoid a decrease in aperture ratio in a configuration where the analog-to-digital conversion circuits are provided in an image pickup element can be provided.

According to the present invention, it is possible to effectively avoid a decrease in aperture ratio in a configuration where analog-to-digital conversion circuits are provided in an image pickup element.

BRIEF DESCRIPTION OF DRAWINGS

FIGS. 9A, 9B, 9C, 9D, and 9E are signal waveform charts of assistance in explaining the operation of the filter unit of FIG. 8;

FIGS. 12A, 12B, and 12C are signal waveform charts of assistance in explaining the operation of an analog-to-digital conversion circuit in the pixel of FIG. 10;

FIGS. 13A, 13B, 13C, and 13D are signal waveform charts of assistance in explaining the operation of the filter unit of FIG. 11;

BEST MODE FOR CARRYING OUT THE INVENTION

Figure 1:
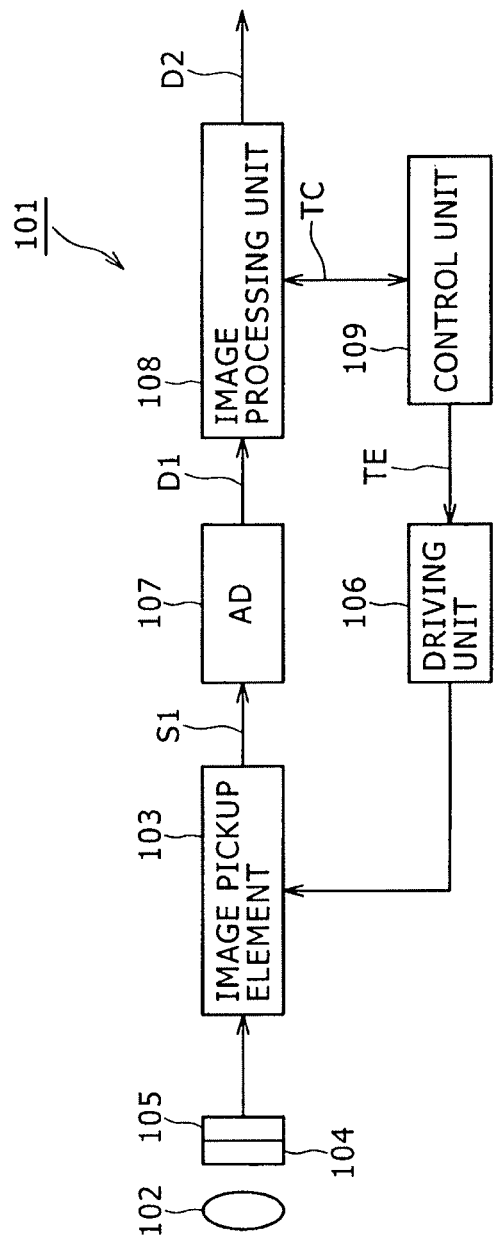
FIG. 1 is a block diagram showing an image pickup device according to a first embodiment of the present invention.

Embodiments of the present invention will hereinafter be described in detail, referring to the drawings as required.

(1) Configuration of First Embodiment

FIG. 1 is a block diagram showing an image pickup device according to a first embodiment of the present invention. The image pickup device 101 data-compresses a result of picking up an image of a desired subject, and records the result on a recording medium or sends out the result to a desired transmission destination.

A lens 102 in the image pickup device 101 varies a zoom magnification and a diaphragm in response to an operation by a user, and condenses incident light on an image pickup surface of an image pickup element 103. An optical low-pass filter 104 suppresses a high spatial frequency component from outgoing light from the lens 102. A following color correction filter 105 corrects the color temperature of outgoing light emitted from the optical low-pass filter 104, and then emits the light.

The image pickup element 103 is formed by a CMOS solid-state image pickup element, for example. The image pickup element 103 operates on various timing signals output from a driving unit 106 to subject an optical image formed on the image pickup surface to photoelectric conversion by each pixel, and then output an image pickup signal S1.

The driving unit 106 is controlled by a control unit 109 to generate the various timing signals for the image pickup element 103 and then output the timing signals to the image pickup element 103. Thereby the operation of the image pickup element 103 is controlled by the control unit 109.

An analog-to-digital conversion circuit (AD) 107 subjects the image pickup signal S1 to an analog-to-digital conversion process, and then outputs image data D1.

An image processing unit 108 data-compresses the image data D1. The image processing unit 108 outputs encoded data D2 resulting from the process to a recording system or a transmitting system. Thus, in the image pickup device 101, the recording system records the encoded data D2 onto a predetermined recording medium, and the transmitting system transmits the encoded data D2 to an external device.

The control unit 109 includes arithmetic processing means formed by a microcomputer. By executing a predetermined control program, the control unit 109 controls the operation of the whole of the image pickup device 101 in response to an operation of an operating element by the user. Incidentally, while in the present embodiment, the control program is provided by being installed in advance in the image pickup device 101, the control program may be provided by being downloaded via a network such as the Internet or the like or being downloaded from a recording medium. Various recording media such as optical disks, memory cards and the like can be widely applied as such a recording medium.

When the user turns on power, the control unit 109 starts operating to control the operation of the whole so that the image pickup element 103 starts obtaining an image pickup result in response to an operation of an operating element by the user and so that the recording or transmission of the image pickup result is started.

Figure 2:
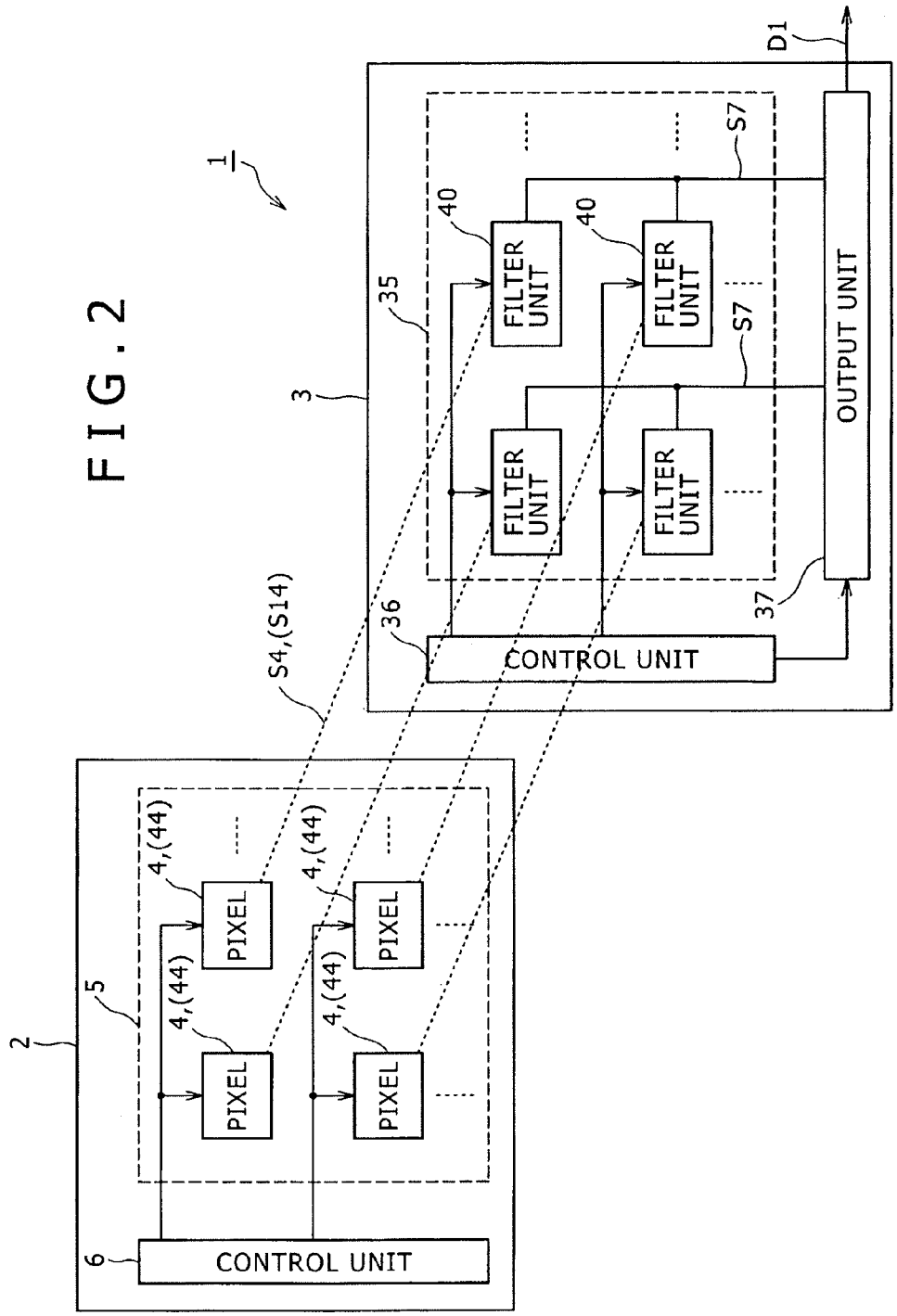
FIG. 2 is a block diagram showing an integrated circuit applied to the image pickup device of FIG. 1.

FIG. 2 is a block diagram showing an integrated circuit 1 applied to the image pickup device 101. This integrated circuit 1 is an integrated circuit of the image pickup element, and is formed by packaging a laminate of a sensor chip 2 and a logic chip 3. In the image pickup device 101, the integrated circuit 1 forms the image pickup element 103, the driving unit 106, the analog-to-digital conversion circuit 107, and an input stage of the image processing unit 108.

The sensor chip 2 is a semiconductor chip including the image pickup element that outputs an image pickup result by an XY address system. In the present embodiment, a CMOS solid-state image pickup element is applied to the image pickup element. The sensor chip 2 includes an image pickup part 5 in which pixels 4 are arranged in the form of a matrix, and a control unit 6 for controlling the operation of the image pickup part 5. Each pixel 4 is provided with an analog-to-digital conversion circuit for subjecting an image pickup result to an analog-to-digital conversion process.

Figure 3:
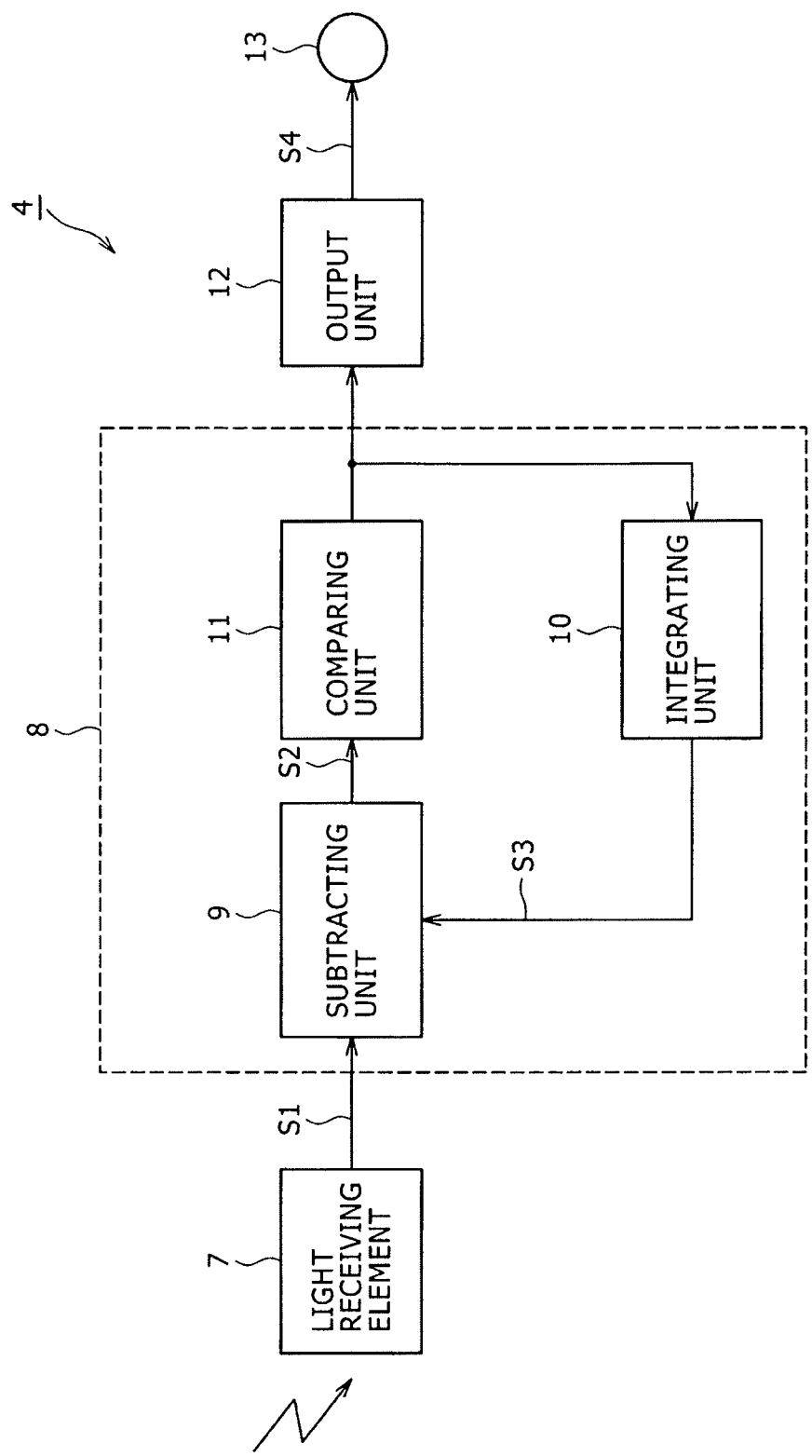
FIG. 3 is a block diagram showing a configuration of each pixel in the image pickup device of FIG. 2.
Figure 4:
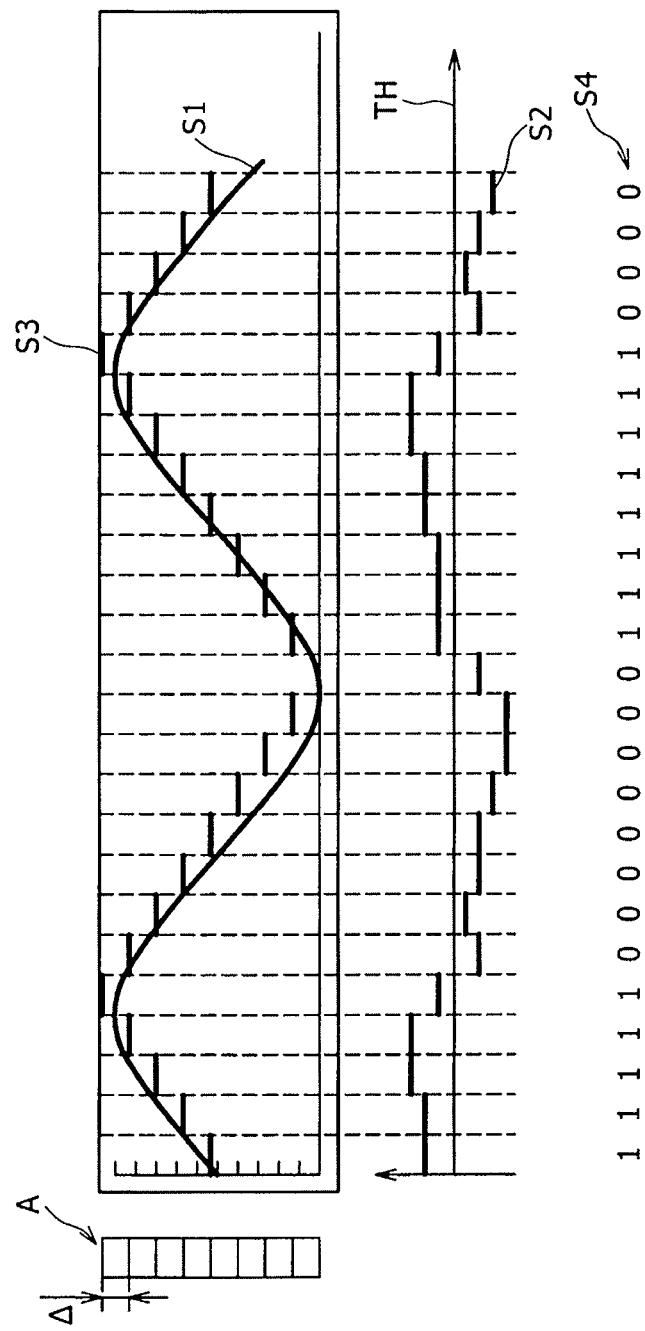
FIGS. 4A, 4B, and 4C are signal waveform charts of assistance in explaining the operation of an analog-to-digital conversion circuit in the pixel of FIG. 3.

Specifically, as shown in FIG. 3 and FIGS. 4A, 4B, and 4C, each pixel 4 outputs an image pickup signal S1 (FIG. 4A) that changes in signal level according to incident light from a light receiving element 7. An analog-to-digital conversion circuit 8 is a delta modulation type analog-to-digital conversion circuit. The analog-to-digital conversion circuit 8 converts the image pickup signal S1 into a digital signal, and then outputs the digital signal. Specifically, a subtracting unit 9 in the analog-to-digital conversion circuit 8 samples the image pickup signal S1 in a predetermined period, subtracts an output signal S3 of an integrating unit 10 from a result of the sampling, and then outputs a difference signal S2 (FIG. 4B). A comparing unit 11 subjects the difference signal S2 to a determination using a predetermined determination reference TH, and then outputs a result of the determination. The integrating unit 10 integrates this result of the determination, and then outputs an output signal S3 (FIG. 4A). Thereby the analog-to-digital conversion circuit 8 obtains, by the comparing unit 11, the determination result whose logical value changes to logic 1 and logic 0 in accordance with an increase and a decrease, respectively, in signal level of the image pickup signal S1. The analog-to-digital conversion circuit 8 outputs this determination result as a result of analog-to-digital conversion of the image pickup signal S1 (FIG. 4C).

Incidentally, as indicated by an arrow A, the analog-to-digital conversion circuit 8 converts the image pickup signal S1 into a digital signal with a resolution Δ determined by a gain of the integrating unit 10. In the present embodiment, the resolution Δ is set to ⅛ of a maximum amplitude of the image pickup signal S1. The analog-to-digital conversion circuit 8 thus forms a three-bit analog-to-digital conversion circuit. In addition, the image pickup signal S1 is thus subjected to a process of analog-to-digital conversion with three bits, and a result of the analog-to-digital conversion is output as a one-bit digital signal. A quantization error in the series of processes is fed back by the integrating unit 10 to be corrected.

An output unit 12 is a buffer circuit that outputs the result of the analog-to-digital conversion as a result of comparison of the comparing unit 11. The output unit 12 outputs a digital signal S4 from an output terminal 13 provided to the sensor chip 2.

The sensor chip 2 has the analog-to-digital conversion circuit 8 and the output unit 12 formed on rear surface opposite from a light receiving surface. A micro-bump formed on the rear surface forms the output terminal 13. Thereby the sensor chip 2 outputs the digital signal S4 as a result of image pickup of each pixel 4 in a simultaneous and parallel manner.

Figure 5:
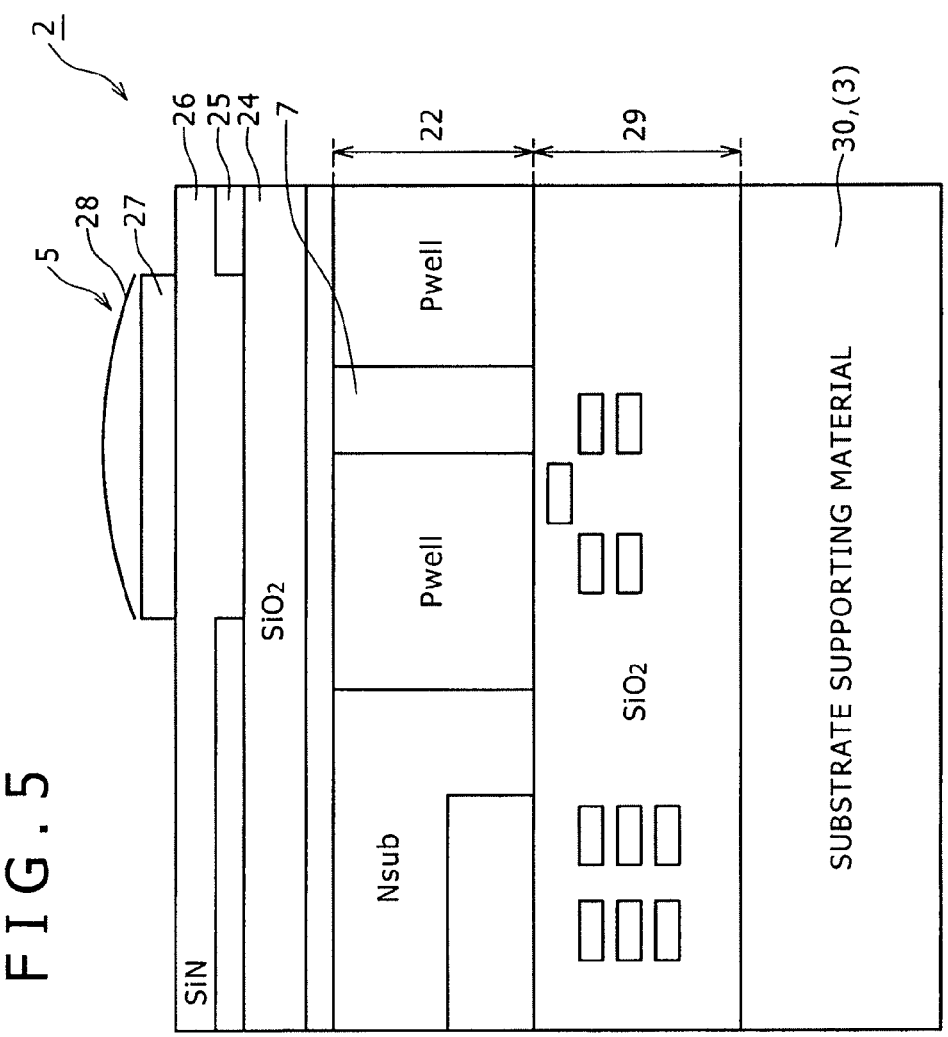
FIG. 5 is a sectional view of a structure of a sensor chip in the image pickup device of FIG. 2.

FIG. 5 is a sectional view of a part of the sensor chip 2. The sensor chip 2 has an element layer 22 formed by a silicon (Si) layer having a thickness of about 10 to 20 [μm]. The light receiving element 7 is formed in the element layer 22. A silicon oxide ($SiO_2$) film 24, a light shielding film 25, a silicon nitride (SiN) film 26, a color filter 27, and a microlens 28 are sequentially laminated in layers over the part of the light receiving element 7, whereby a pixel 4 is formed. A wiring layer 29 for wiring the light receiving element 7 and circuit elements and the like of the analog-to-digital conversion circuit 8 is formed in a layer under the element layer 22. A substrate supporting material 30 for retaining the whole is provided on an under layer side of the wiring layer 29. Thereby, the sensor chip 2 has the wiring layer 29 provided on the opposite side from the light receiving surface, and has the analog-to-digital conversion circuit 8 and the like provided on the opposite side from the light receiving surface. Thus, even when the analog-to-digital conversion circuit 8 is provided to each pixel 4, a decrease in aperture ratio can be avoided effectively. In addition, various restrictions when the wiring layer is provided on the side of the light receiving surface are eliminated, and thus a degree of freedom of wiring is greatly improved.

Figure 6:
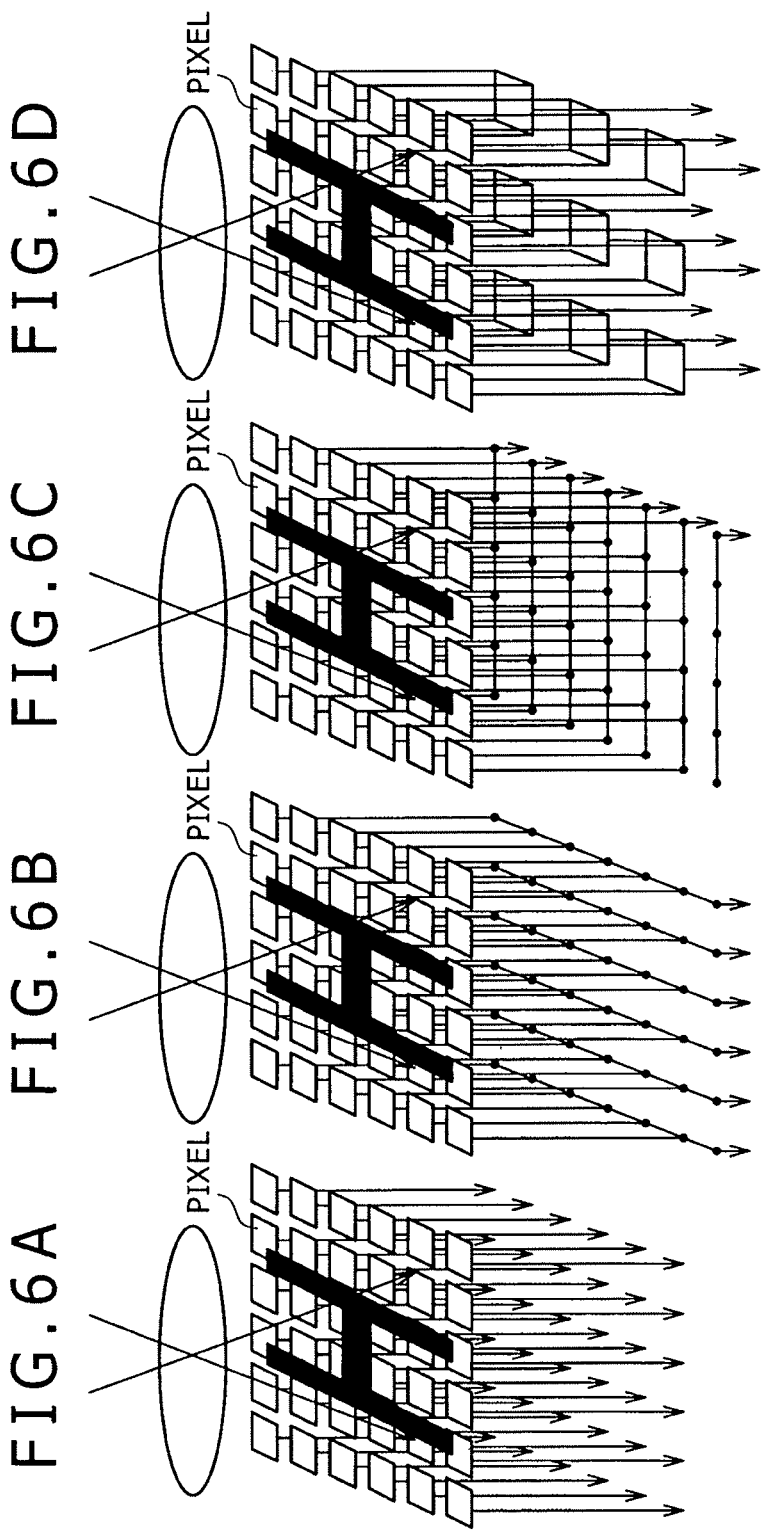
FIG. 6A, FIG. 6B, FIG. 6C, and FIG. 6D are schematic diagrams of assistance in explaining output of image pickup results by the sensor chip of FIG. 5.

Incidentally, when the wiring layer 29 is thus provided on the rear side of the light receiving surface, as shown in FIG. 6A, for example, a connection between the image pickup element part and a peripheral circuit can be formed such that each pixel output is individually output to the peripheral circuit for analog-to-digital conversion processing. Instead of this, as shown in FIG. 6B, image pickup results can be output with a column line as a unit and then processed by the peripheral circuit. In addition, as shown in FIG. 6C, image pickup results can be output with a line as a unit, and then processed by the peripheral circuit. Further, as shown in FIG. 6D, image pickup results can be output with a predetermined block as a unit, and then processed by the peripheral circuit.

Specifically, the CMOS solid-state image pickup element selectively turns on a MOSFET provided to each pixel 4 by a horizontal address line extending in a horizontal direction and a vertical address line extending in a vertical direction, whereby an image pickup result is output from the pixel selected by the horizontal address line and the vertical address line to a signal line. Thereby the CMOS solid-state image pickup element can output image pickup results by various XY address controls as in FIGS. 6A to 6C, for example.

More specifically, in the example of FIG. 6A, since a signal line is provided for each pixel, MOSFETs provided to all pixels are simultaneously turned on, for example, and thus results of image pickup of all the pixels are output in a simultaneous and parallel manner. In the example shown in FIG. 6B, a plurality of pixels contiguous in the vertical direction share a signal line formed by one column line. By sequentially changing settings of horizontal address lines for the plurality of pixels connected to one column line and thereby sequentially turning on MOSFETs provided in the plurality of pixels, the column line is allocated to the pixels contiguous in the vertical direction by time division, and image pickup results of these pixels are output. As viewed in the horizontal direction, pixels contiguous in the horizontal direction share a horizontal address line. Such time-division allocation of pixels contiguous in the vertical direction to a column line is performed in pixels contiguous in the horizontal direction in a simultaneous and parallel manner, whereby image pickup results are output in line units by controlling the horizontal address lines. In the case of FIG. 6C, by control of vertical address lines rather than the control of the horizontal address lines as described above with reference to FIG. 6B, one signal line is sequentially allocated to pixels contiguous in the horizontal direction by time division, and image pickup results of pixels contiguous in the vertical direction are output in a simultaneous and parallel manner.

On the other hand, in the example of FIG. 6D, a plurality of pixels in one block connected to one common signal line are sequentially selected by controlling vertical address lines and horizontal address lines, whereby image pickup results can be output in various sequences of raster scanning, zigzag scanning and the like in the block through the signal line. Incidentally, the horizontal address lines and the vertical address lines are provided so as to be common to pixels contiguous in the horizontal direction and the vertical direction, so that the sequence of scanning of these pixels is the same in a plurality of blocks.

Incidentally, since the sensor chip 2 has the wiring layer 29 on the opposite side from the light receiving surface, a thin semiconductor substrate is processed from the side of the wiring layer 29 to form the light receiving element 7 and circuit elements of the peripheral circuit. Then the wiring layer 29 and the substrate supporting material 30 are sequentially formed on the semiconductor substrate. Thereafter, the semiconductor substrate is turned over, the element layer 22 is completed by CMP polishing, and then the light shielding film 25, the silicon nitride (SiN) film 26, the color filter 27, and the microlens 28 are sequentially formed, whereby the sensor chip 2 is produced.

Figure 7:
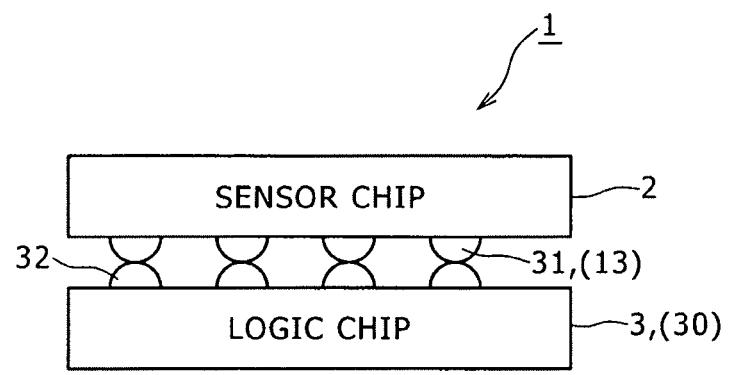
FIG. 7 is a sectional view of assistance in explaining a connection between the sensor chip and a logic chip in the image pickup device of FIG. 2.

As shown in FIG. 7, the logic chip 3 is assigned to the substrate supporting material 30, and the sensor chip 2 is electrically connected to the logic chip 3 and retained by micro-bumps 31, formed on the wiring layer 29 side and micro-bumps 31, formed on the logic chip 3. Incidentally, a micro-bump is a minute terminal for connection which terminal is formed of gold, copper or the like.

The logic chip 3 (FIG. 2) is an integrated circuit formed by a digital signal processing circuit for processing the image pickup result of each pixel 4. In the present embodiment, the digital signal processing circuit includes: a filter circuit 35 for processing an image pickup result as a digital signal output from each pixel of the sensor chip 2 for each pixel; a control unit 36 for controlling the operation of the filter circuit 35 in conjunction with the control of the image pickup part 5 in the sensor chip 2; and an output unit 37 for subjecting a result of the processing of the filter circuit 35 to time division multiplexing and outputting the result under control of the control unit 36.

Hence, the filter circuit 35 has, in correspondence with the pixels 4 in the sensor chip 2, filter units 40 for processing digital signals from the respective pixels 4. Each of the filter units 40 is provided with a micro-bump 32. Thus, in the filter circuit 35, image pickup results S4 of respective pixels 4 output from the sensor chip 2 are input to the corresponding filter units 40, where the image pickup results S4 of the respective pixels 4 are converted into image data.

Figure 8:
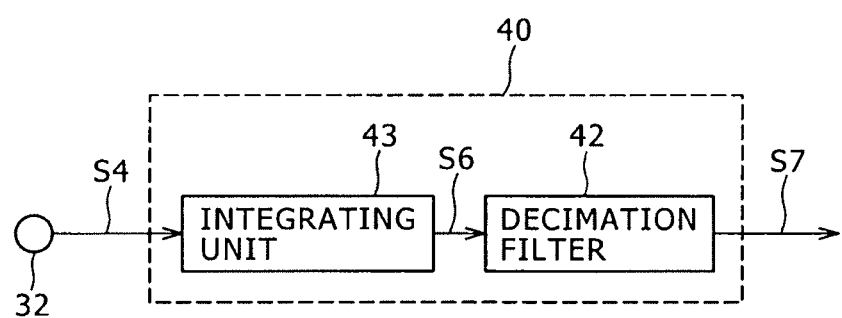
FIG. 8 is a block diagram showing a configuration of a filter unit in the image pickup device of FIG. 2.

As shown in FIG. 8, an integrating unit 43 in the filter unit 40 sequentially integrates the digital signal S4 output from each pixel 4 in a clock period of the digital signal S4, and then outputs the result. In the present embodiment, as shown in FIGS. 9A to 9C, when the digital signal S4 is logic 1, the integrating unit 43 adds a value 1 to an addition result S6 up to that time, and then outputs the addition result S6, whereas when the digital signal S4 is logic 0, the integrating unit 43 subtracts a value 1 from an addition result S6 up to that time, and then outputs the addition result S6.

A decimation filter 42 subjects the addition result S6 to a filtering process, thereby converts a digital signal as the addition result S6 into image data S7 at a predetermined sampling rate, and then outputs the image data S7. The decimation filter 42 reduces the sampling rate of the digital signal S4 to 1/n, and outputs the image data S7. Therefore consecutive addition results S6 are added together by an n-tap filter in corresponding sampling timing, and then the result is output. In the present embodiment, the value n is set to eight. Thus, as shown in FIG. 9D, for every eight samples of the addition results S6, the addition results S6 of the eight consecutive samples are added together, and then six-bit image data S7 is output.

A number shown at each sample in FIG. 9D is a value of the addition of eight consecutive samples as described above. In FIG. 9E where the value n is set to four, sampling rate is raised and the number of bits of the image data S7 is correspondingly reduced. In this case, for every four samples of the addition results S6, the decimation filter 42 adds together the addition results S6 of the four consecutive samples, and then the decimation filter 42 outputs five-bit image data S7. Thus, the decimation filter 42 can change the number of gradation levels by changing the number of taps used in arithmetic processing, and change the sampling rate in conjunction with the changing of the number of gradation levels. Thus, by setting the number of taps, the image pickup device 101 can output image data S7 at a desired frame rate. Incidentally, while in the present embodiment, description has been made of a case where addition results S6 are processed by simple addition, a filter process with better frequency characteristics may be applied instead.

In the logic chip 3, the image data S7 thus generated for each pixel 4 is sequentially transferred to the output unit 37 in line units, for example, under control of the control unit 36, and the image data S7 is time-division-multiplexed and output by the output unit 37. Thereby the image pickup device 101 outputs image data D1 in order of raster scanning.

(2) Operation of First Embodiment

In the image pickup device 101 (FIG. 2) with the above configuration, an optical image is formed on the image pickup surface of the sensor chip 2 by a predetermined optical system, the optical image is subjected to a photoelectric conversion process by each of the pixels 4 arranged in the form of a matrix, and then an image pickup result of each pixel 4 is obtained. Further, the image pickup result of each pixel 4 is converted into a digital signal S4 by the analog-to-digital conversion circuit 8 provided in a surface on the opposite side from the image pickup surface of the sensor chip 2. The digital signal S4 is input to the filter circuit 35 of the logic chip 3, where the image pickup result of each pixel is converted into image data, and the image data is output.

Thus, in the image pickup device 101, the analog-to-digital conversion circuit 8 provided to each pixel 4 converts an image pickup result into a digital signal, and the logic chip 3 processes the digital signal, so that a peripheral circuit configuration can be correspondingly simplified. Even when the analog-to-digital conversion circuit 8 is thus provided to each pixel, the analog-to-digital conversion circuit 8 is provided in the surface on the opposite side from the image pickup surface. Therefore a decrease in aperture ratio of each pixel 4 due to the wiring or the like of the analog-to-digital conversion circuit 8 can be avoided effectively, and further a crosstalk or the like between adjacent pixels due to the wiring can be reduced. In addition, in each pixel 4, a decrease in occupied area of the image pickup surface as in the case where the analog-to-digital conversion circuit is provided in the image pickup surface can be prevented. It is thereby possible to make miniaturization of pixels easier, and make the manufacturing of this image pickup device easier. It is also possible to greatly improve a degree of freedom of connection to the subsequent logic chip 3, and correspondingly improve a degree of freedom of design.

Digital signal processing is thus performed by the logic chip 3. In the image pickup device 101, a digital signal as each image pickup result is output to the logic chip 3 through a connection formed by micro-bumps. The image pickup device 101 can thereby output image pickup results to the logic chip 3 on a pixel parallel basis so that the sampling rate of the analog-to-digital conversion circuit 8 can be set high. In addition, digital signal processing can be performed on a pixel parallel basis. It is therefore possible to process the image pickup result without providing a memory or the like for temporarily recording the digital signal, for example, and thus correspondingly simplify the configuration. Further, since digital signal processing can thus be performed on a pixel parallel basis, the frame rate can also be raised.

In the image pickup device 101, the analog-to-digital conversion circuit 8 as a prerequisite for the digital signal processing is formed by a delta modulation type analog-to-digital conversion circuit (FIG. 3). The digital signal processing in the logic chip 3 includes the filter circuit 35 for reducing the sampling rate of the digital signal S4 obtained from the analog-to-digital conversion circuit 8, and the output unit 37 for subjecting a result of the processing of the filter circuit 35 to a time division multiplexing process and then outputting the result. It is thereby possible to convert image pickup results into image data with a desired sampling rate, a desired number of gradation levels, and a desired scanning sequence, and then output the image data.

(3) Effects of First Embodiment

According to the above configuration, the analog-to-digital conversion circuit provided in the surface on the opposite side from the image pickup surface in the semiconductor chip makes it possible to effectively avoid a decrease in aperture ratio in the configuration where the analog-to-digital conversion circuit is provided in the image pickup element.

Specifically, in the configuration where a delta modulation type analog-to-digital conversion circuit is applied to the analog-to-digital conversion circuit and the analog-to-digital conversion circuit is provided in the image pickup element, a decrease in aperture ratio can be effectively avoided.

In addition, by time-division-multiplexing and outputting a digital signal of each pixel thus obtained, it is possible to output image pickup results in the sequence of raster scanning, for example, and process image data using a decoder or the like that processes the image data in the raster scanning sequence, so that the peripheral circuit and the like associated with the CMOS solid-state image pickup element can be used effectively.

In addition, by connecting and laminating a chip sensor provided with analog-to-digital conversion circuits to the semiconductor chip including the integrated circuit formed by a digital signal processing circuit for the process of such time division multiplexing and the like by micro-bumps, it is possible to perform digital signal processing on a result of analog-to-digital conversion processing in each pixel unit stably and in a simultaneous and parallel manner. Thereby image pickup results can be processed reliably at a high frame rate.

That is, by providing a micro-bump for each pixel, it is possible to output a result of analog-to-digital conversion processing of each pixel in a simultaneous and parallel manner, and then perform digital signal processing.

In addition, by applying a decimation filter circuit as a filter circuit for converting the sampling rate to the digital signal processing circuit, it is possible to output image pickup results with a desired number of gradation levels or a desired sampling rate.

(4) Second Embodiment

Figure 10:
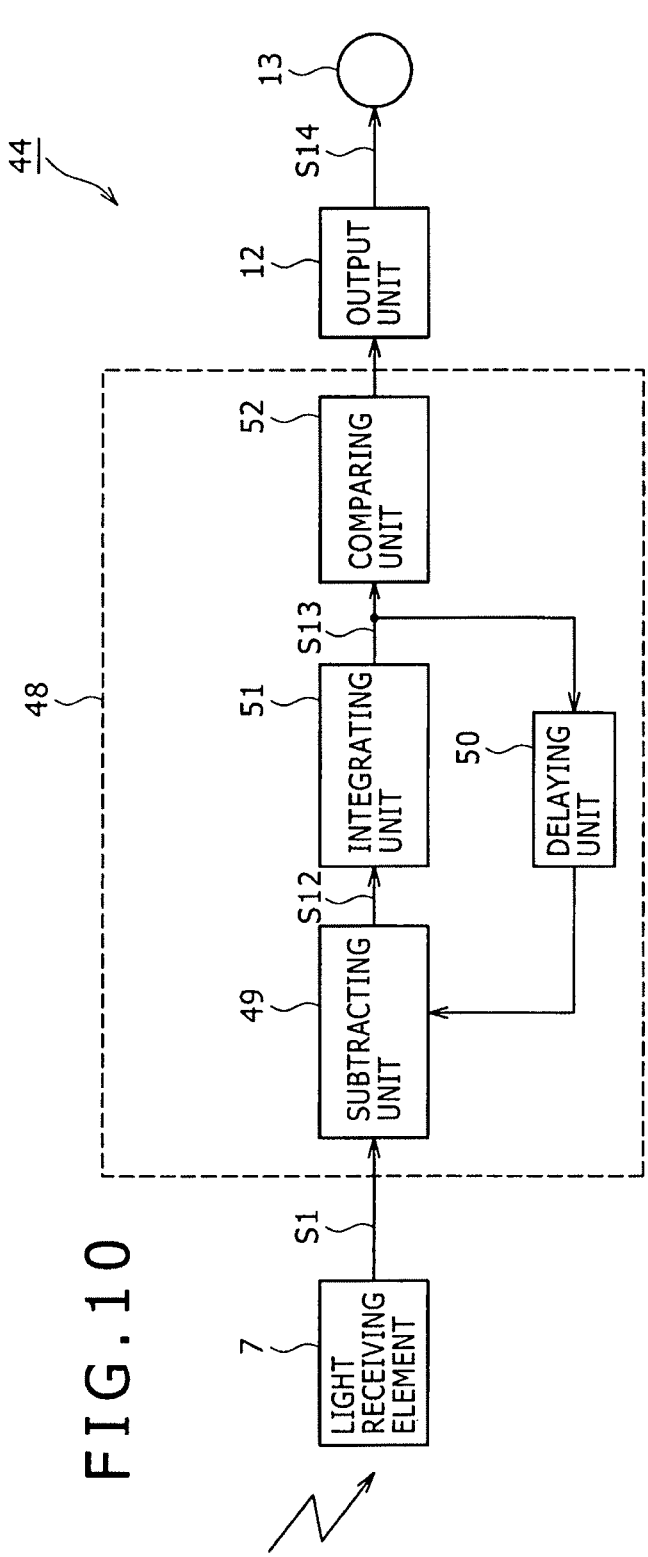
FIG. 10 is a block diagram showing a configuration of each pixel in an image pickup device according to a second embodiment of the present invention.
Figure 11:
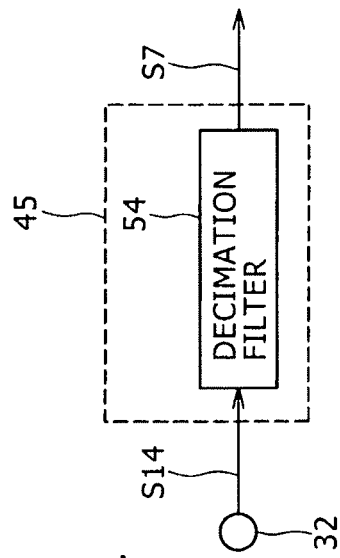
FIG. 11 is a block diagram showing a configuration of a filter unit in the image pickup device according to the second embodiment of the present invention.

FIG. 10 and FIG. 11 are block diagrams showing a configuration of a pixel and a filter unit applied to an image pickup device according to a second embodiment of the present invention. The pixel 44 and the filter unit 45 shown in FIG. 10 and FIG. 11 are applied to the image pickup device according to the present embodiment in place of the pixel 4 and the filter unit 40 of the first embodiment. Incidentally, the image pickup device according to the present embodiment is formed in the same manner as the image pickup device 101 according to the first embodiment except for the different configuration of the pixel 44 and the filter unit 45. Therefore repeated description will be omitted in the present embodiment.

The pixel 44 subjects an image pickup signal S1 of a light receiving element 7 to analog-to-digital conversion processing by an analog-to-digital conversion circuit 48, and outputs a digital signal S14 as a result of the processing to a logic chip via an output unit 12 and an electrode 13 formed by a micro-bump.

The analog-to-digital conversion circuit 48 is a delta sigma modulation type analog-to-digital conversion circuit. As shown in FIGS. 12A, 12B, and 12C, a subtracting unit 49 samples the image pickup signal S1 in a predetermined period, subtracts an output signal of a delaying unit 50 from a result of the sampling, and then outputs a difference signal S12 (FIGS. 12A and 12B).

An integrating unit 51 integrates the difference signal S12, and then outputs an integrated signal S13. A comparing unit 52 subjects the integrated signal S13 to a determination using a predetermined threshold voltage TH, and then outputs a determination result S14 (FIG. 12C). The delaying unit 50 delays the determination result S14 by one sampling period, and then feeds back the determination result S14 to the subtracting unit 49. Incidentally, in these processes, the output signal output from the delaying unit 50 is set such that signal levels corresponding to maximum amplitudes on a positive side and a negative side of the image pickup signal S1 are respectively signal levels of determination results of logic 1 and logic 0 in the comparing unit 52. Thus, the analog-to-digital conversion circuit 48 feeds back the determination result and outputs the digital signal S14 by logic 1 and logic 0 according to the signal level of the image pickup signal S1.

In correspondence with the configuration of the analog-to-digital conversion circuit 48, the filter unit 45 (FIG. 11) is formed by a decimation filter 54. The digital signal S14 is input to the decimation filter 54 via an electrode 32 formed by a micro-bump. As shown in FIGS. 13A to 13D by contrast with FIGS. 9A to 9E, the digital signal S14 is subjected to a filtering process, whereby the digital signal S14 is converted into image data S7 with a predetermined sampling rate, and then the image data S7 is output. Thus, the filter unit 45 can change the number of gradation levels by changing the number of taps used in arithmetic processing of the decimation filter 54, and change the sampling rate in conjunction with the changing of the number of gradation levels. Thereby the image data S7 can be output at a desired frame rate.

In the present embodiment, the analog-to-digital conversion circuit is provided in a surface on an opposite side from an image pickup surface in a semiconductor chip. Thereby a decrease in aperture ratio can be avoided effectively in the configuration where the analog-to-digital conversion circuit is provided in an image pickup element. A delta sigma modulation type analog-to-digital conversion circuit is applied to the analog-to-digital conversion circuit. Thereby integration processing on a logic chip side is omitted. Further, an image pickup result is integrated on a sensor chip side. Thereby, even when an error occurs in transmission of a digital signal as image pickup result, it is possible to limit effects of the error, and thus improve reliability.

(5) Third Embodiment

Figure 14:
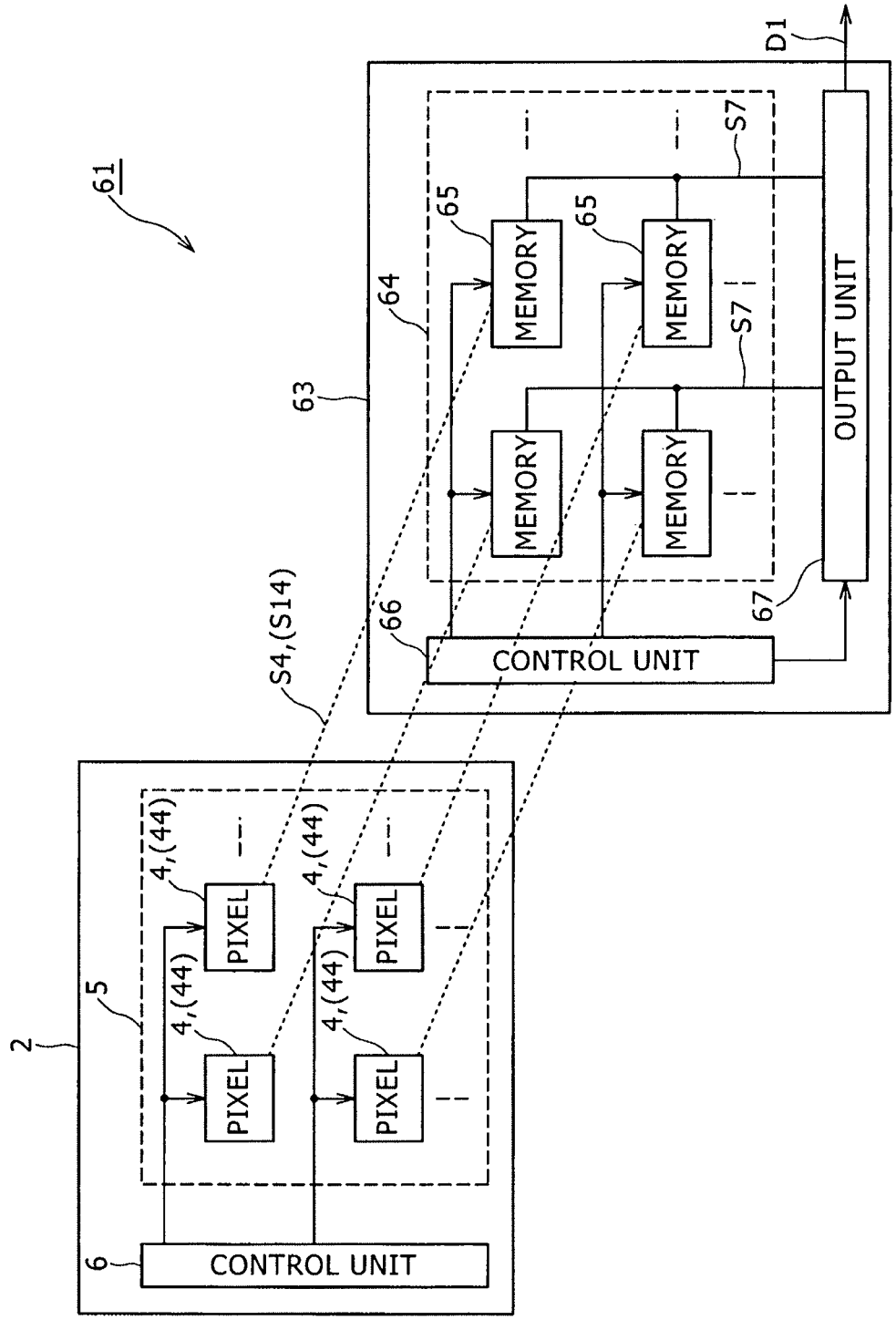
FIG. 14 is a block diagram showing an image pickup device according to a third embodiment of the present invention.

FIG. 14 is a block diagram showing an integrated circuit 61 applied to an image pickup device according to a third embodiment of the present invention by contrast with FIG. 2.

The image pickup device according to the present embodiment is formed in the same manner as the image pickup device according to the first embodiment or the second embodiment except for a different digital signal processing circuit mounted in a logic chip 63. Incidentally, in the following, the same configurations as in the image pickup device according to the first embodiment or the second embodiment are identified by corresponding reference numerals, and repeated description thereof will be omitted.

In the present embodiment, a sensor chip 2 is laminated to the logic chip 63 using micro-bumps. The digital signal processing circuit 64 of the logic chip 63 includes memories 65 having a capacity of a few to a few ten bits, the memories 65 each storing a digital signal S4 (S14) of each pixel. The logic chip 63 includes: the digital signal processing circuit 64 including the memories 65; an output unit 67 for outputting output data from each memory 65 to an outside; and a control unit 66 for controlling the operation of the memories 65 and the output unit 67.

Thus, the image pickup device buffers a digital signal as image pickup result of each pixel by each memory unit 65, and then outputs the digital signal in a unit of a predetermined amount of data in the sequence of raster scanning, for example.

According to the present embodiment, an analog-to-digital conversion circuit is provided in a surface on an opposite side from an image pickup surface in a semiconductor chip. Thereby a decrease in aperture ratio can be avoided effectively in the configuration where the analog-to-digital conversion circuit is provided in an image pickup element. A digital signal is stored in the memory circuit on the logic chip side and then output. It is thereby possible to achieve consistency with processing timing of a processing circuit in a subsequent stage.

(6) Fourth Embodiment

Figure 15:
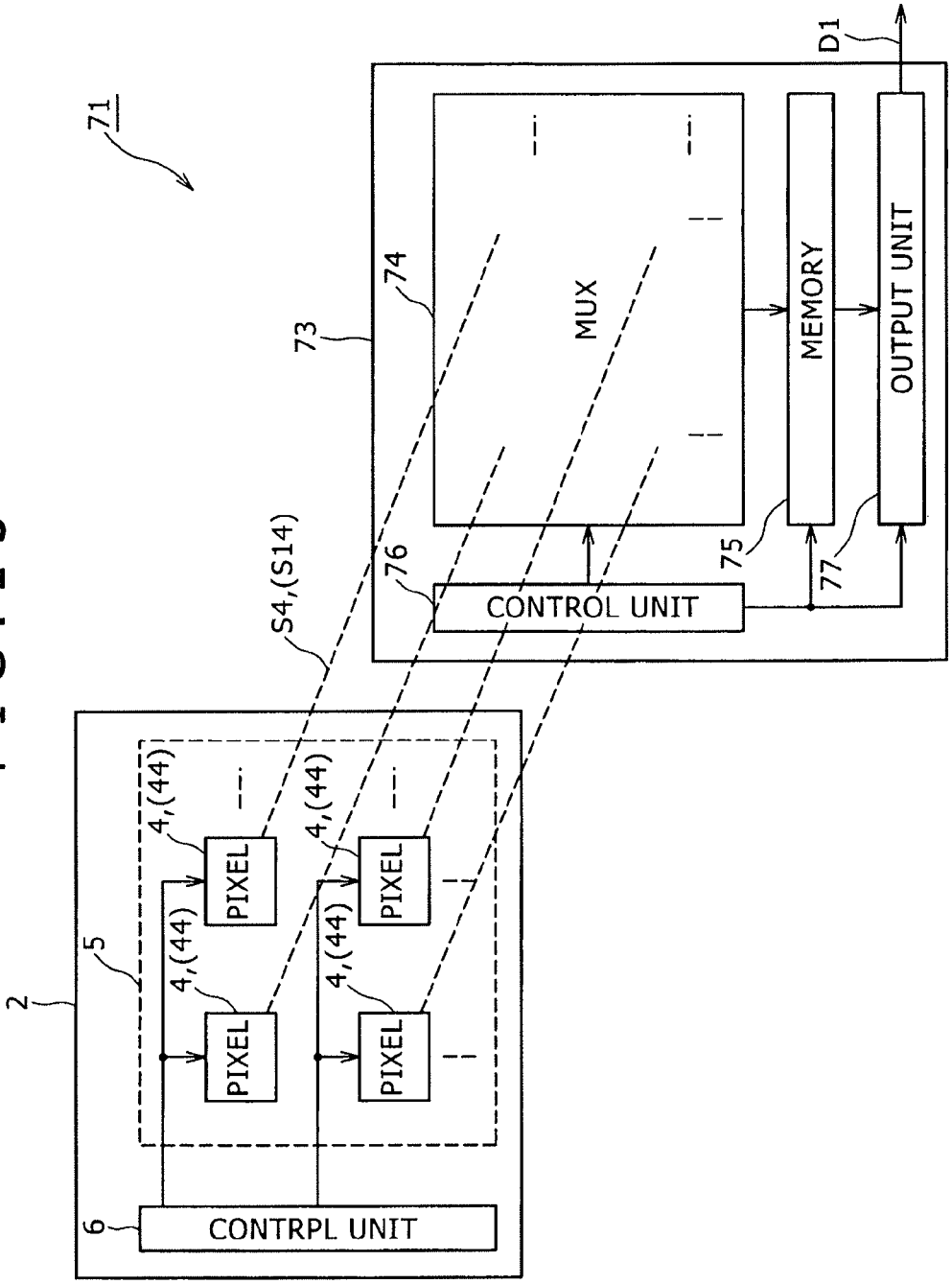
FIG. 15 is a block diagram showing an image pickup device according to a fourth embodiment of the present invention.

FIG. 15 is a block diagram showing an integrated circuit 71 applied to an image pickup device according to a fourth embodiment of the present invention by contrast with FIG. 2. The image pickup device according to the present embodiment is formed in the same manner as the image pickup device according to the first embodiment or the second embodiment except for different digital signal processing implemented in a logic chip 73. Incidentally, in the following, the same configurations as in the image pickup device according to the first embodiment or the second embodiment are identified by corresponding reference numerals, and repeated description thereof will be omitted.

In the present embodiment, a sensor chip 2 is laminated to the logic chip 73 using micro-bumps. A digital signal S4 (S14) of each pixel is input to a multiplexer (MUX) 74. The multiplexer 74 for example includes a plurality of registers that input the digital signals S4 (S14) output from the pixels 4 (44) of the sensor chip 2 to each bit. The multiplexer 74 combines the respective one-bit digital signals S4 (S14) of a predetermined number of pixels 4 (44) contiguous in a horizontal direction into a bit-parallel digital signal, and then outputs the bit-parallel digital signal.

A control unit 76 controls the multiplexer 74 to record image pickup results of the respective pixels 4 (44) in each sampling period of the digital signals S4 (S14), and output the image pickup results as digital signals recorded in the multiplexer 74 to a memory 75 in a line unit. The image pickup results in the line unit output to the memory 75 are stored for a predetermined frame period, and then output by control of an output unit 77.

According to the present embodiment, an analog-to-digital conversion circuit is provided in a surface on an opposite side from an image pickup surface in a semiconductor chip. Thereby a decrease in aperture ratio can be avoided effectively in the configuration where the analog-to-digital conversion circuit is provided in an image pickup element. The logic chip side combines digital signals each formed by one bit into a bit-parallel digital signal, and then outputs the bit-parallel digital signal. Thus the image pickup results of a plurality of pixels can be processed in a simultaneous and parallel manner.

(7) Fifth Embodiment

Figure 16:
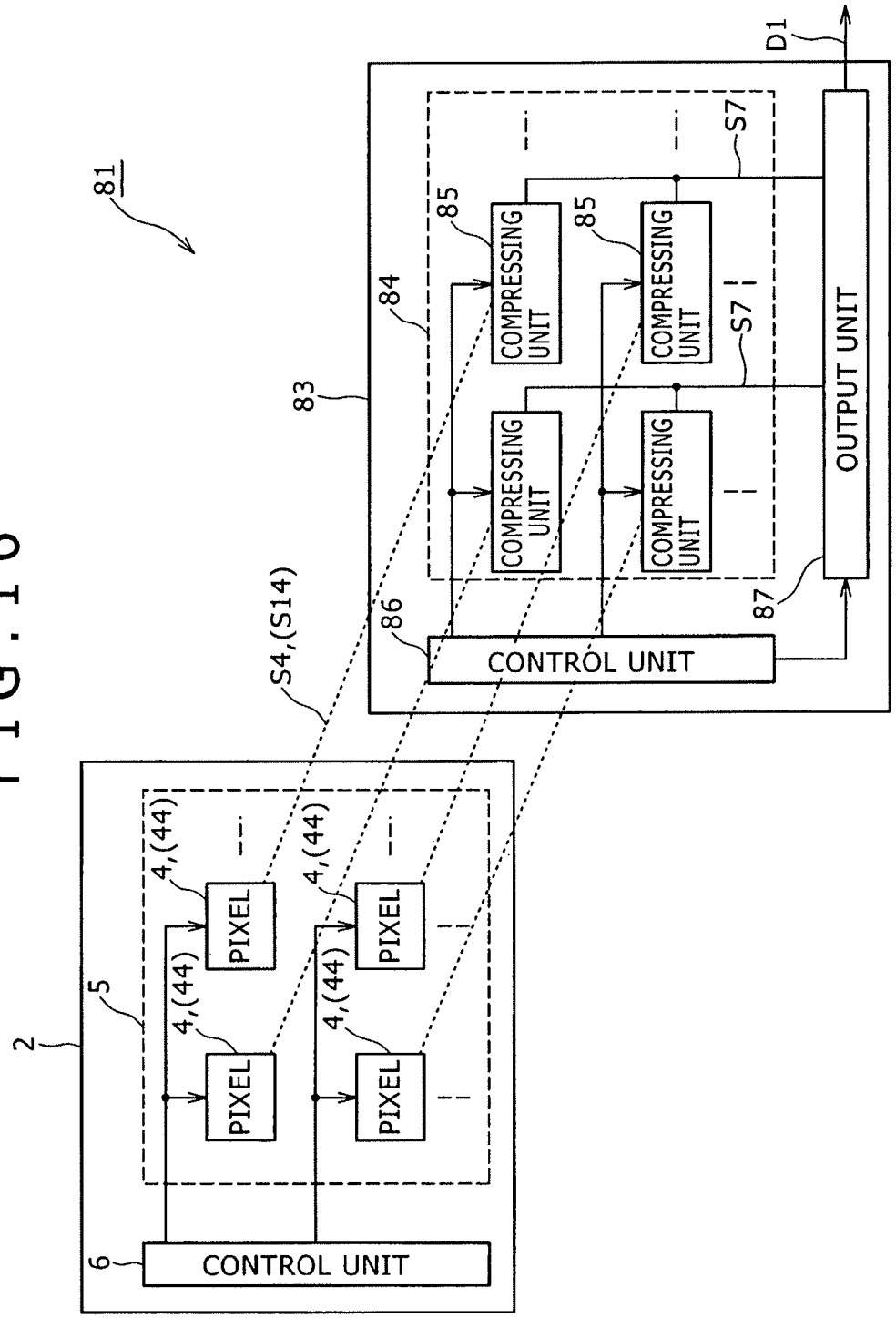
FIG. 16 is a block diagram showing an image pickup device according to a fifth embodiment of the present invention.

FIG. 16 is a block diagram showing an integrated circuit 81 applied to an image pickup device according to a fifth embodiment of the present invention by contrast with FIG. 2. The image pickup device according to the present embodiment is formed in the same manner as the image pickup device according to the first embodiment or the second embodiment except for different digital signal processing implemented in a logic chip 83. Incidentally, in the following, the same configurations as in the image pickup device according to the first embodiment or the second embodiment are identified by corresponding reference numerals, and repeated description thereof will be omitted.

In the present embodiment, a sensor chip 2 is laminated to the logic chip 83 using micro-bumps. A digital signal processing circuit 84 of the logic chip 83 includes compressing units 85 each subjecting a digital signal S4 (S14) of each pixel to data compression. The logic chip 83 includes: the digital signal processing circuit 84 including the compressing units 85; an output unit 87 for outputting output data from the compressing units 85 to an outside; and a control unit 86 for controlling the operation of the compressing units 85 and the output unit 87.

The compressing units 85 subjects the digital signal S4 (S14) to data compression in the direction of a time axis by an arithmetic compression method such as a run length system, for example, and then outputs the result. Thus, the image pickup device subjects an image pickup result of each pixel to the data compression, and outputs the result in a predetermined frame unit in the sequence of raster scanning, for example.

According to the present embodiment, an analog-to-digital conversion circuit is provided in a surface on an opposite side from an image pickup surface in a semiconductor chip. Thereby a decrease in aperture ratio can be avoided effectively in the configuration where the analog-to-digital conversion circuit is provided in an image pickup element. The data compression and output is performed on the logic chip side. Thus, even when image pickup results are obtained and output at a high speed, the image pickup results can be output reliably.

(8) Sixth Embodiment

Figure 17:
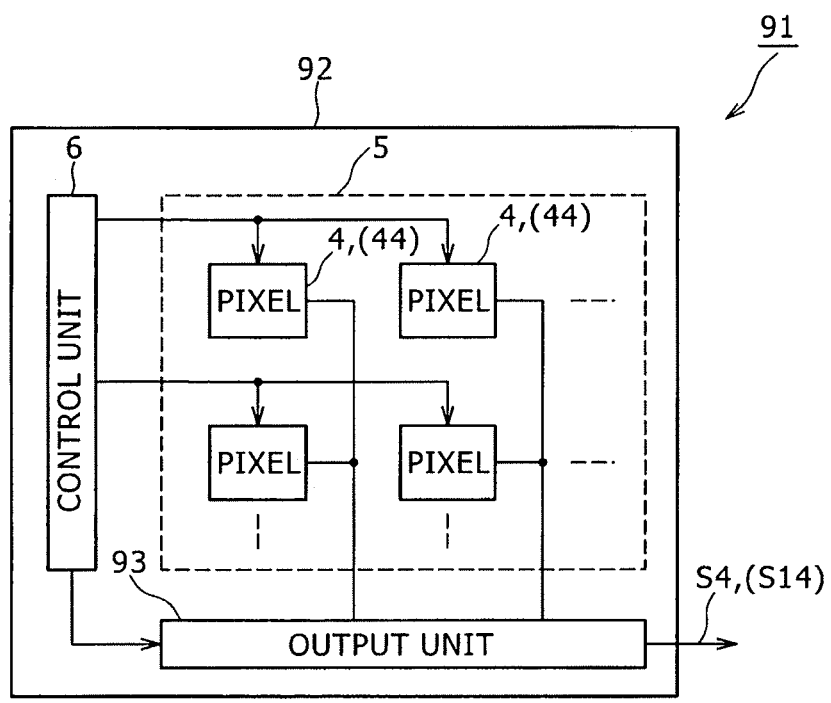
FIG. 17 is a block diagram showing an image pickup device according to a sixth embodiment of the present invention.

FIG. 17 is a block diagram showing an integrated circuit 91 applied to an image pickup device according to a sixth embodiment of the present invention by contrast with FIG. 2. The image pickup device according to the present embodiment subjects an image pickup result of each pixel 4 (44) to analog-to-digital conversion processing by an analog-to-digital conversion circuit formed in a rear surface of a sensor chip 92, and time-division-multiplexes and outputs a digital signal resulting from the processing by an output unit 93 similarly formed in the rear surface of the sensor chip 92. The present embodiment is formed in the same manner as the image pickup device according to the first embodiment or the second embodiment except for different processing of the image pickup result of each pixel.

Even when the output unit is provided on the sensor chip side and image pickup results are multiplexed and output as in the present embodiment, by providing the analog-to-digital conversion circuit in the surface on an opposite side from an image pickup surface in the semiconductor chip, it is possible to effectively avoid a decrease in aperture ratio in the configuration where the analog-to-digital conversion circuit is provided in an image pickup element.

(9) Other Embodiments

It is to be noted that while in the foregoing embodiments, description has been made of a case where the sensor chip is formed by a CMOS solid-state image pickup element, the present invention is not limited to this, and is widely applicable to cases where the sensor chip is formed by various solid-state image pickup elements using an XY address system.

In addition, while in the foregoing embodiments, description has been made of a case where a digital signal processing circuit for data compression processing or the like is provided in a logic chip, the present invention is not limited to this, and is widely applicable to cases where various digital signal processing circuits such for example as a motion detecting circuit are provided.

INDUSTRIAL APPLICABILITY

The present invention is applicable to an image pickup device with a CMOS solid-state image pickup element, for example.

DESCRIPTION OF REFERENCE NUMERALS 1, 61, 71, 81, 91 . . . integrated circuit, 2, 92 . . . sensor chip, 3, 63, 73, 83 . . . logic chip, 4, 44 . . . pixel, 5 . . . image pickup part, 6, 36, 66, 76, 86 . . . control unit, 7 . . . light receiving element, 8, 48, 107 . . . analog-to-digital conversion circuit, 9, 49 . . . subtracting unit, 10, 43, 51 . . . integrating unit, 11 . . . comparing unit, 12, 37, 67, 77, 87, 93 . . . output unit, 13 . . . output terminal, 22 . . . element layer, 24 . . . silicon oxide film, 25 . . . light shielding film, 26 . . . silicon nitride film, 27 . . . color filter, 28 . . . microlens, 29 . . . wiring layer, 30 . . . substrate supporting material, 31, 32 . . . micro-bump, 35 . . . filter circuit, 40, 45 . . . filter unit, 42, 54 . . . decimation filter, 50 . . . delaying unit, 52 . . . comparing unit, 64, 84 . . . digital signal processing circuit, 65, 75 . . . memory, 74 . . . multiplexer, 85 . . . compressing unit, 101 . . . image pickup device, 102 . . . lens, 103 . . . image pickup element, 104 . . . optical low-pass filter, 105 . . . color correction filter, 106 . . . driving unit, 108 . . . image compressing unit.

The invention claimed is:

1. A solid state imaging device comprising:
a first chip in which pixels are arranged in a form of a matrix; and
a second chip including a data processing circuit processing at least a pixel signal from the pixels,
wherein, the relation between the first chip and the second chip is stack configuration,
wherein the solid state imaging device further comprises:
an XY address controller disposed in the first chip to address the pixels by selectively turning on a transistor provided in each pixel;
an analog-to-digital conversion circuit provided for each pixel in the first chip, the analog-to-digital conversion circuit provided on an opposite side from said light receiving surface side in the first chip; and
a buffer unit disposed on the opposite side of the first chip, and outside of the analog-to-digital conversion circuit, the buffer unit being connected, at one end, to an output of the analog-to-digital conversion circuit for each pixel in the first chip, and being connected, at another end, to one of a first plurality of output terminals provided on the opposite side of the first chip, the first plurality of outer terminals of the first chip connecting to a second plurality of output terminals provided on the second chip.

2. The solid state imaging device of claim 1, wherein the first chip is stacked on the second chip.

3. The solid state imaging device of claim 1, wherein the data processing circuit includes at least one storing unit to store a digital signal corresponding to the pixel signal.

4. The solid state imaging device of claim 1, wherein the analog-to-digital conversion circuit converts an analog signal from each of the pixels to a digital signal.

5. The solid state imaging device of claim 4, wherein all functions of the analog-to-digital conversion circuit is disposed on the first chip.

6. The solid state imaging device of claim 4, wherein the analog-to-digital conversion circuit is a delta modulation type analog-to-digital conversion circuit.

7. The solid state imaging device of claim 4, wherein the analog-to-digital conversion circuit is a delta sigma modulation type analog-to-digital conversion circuit.

8. The solid state imaging device of claim 1, wherein the data processing circuit includes a multiplexer to combine a plurality of pixel signals from the pixel matrix.

9. The solid state imaging device of claim 8, further comprising a memory unit connected to the multiplexer in the second chip.

10. The solid state imaging device of claim 9, further comprising an output unit connected to the memory unit in the second chip.

11. The solid state imaging device of claim 1, further comprising a control unit disposed in the second chip to control the data processing circuit.

12. The solid state imaging device of claim 1, wherein the pixels are disposed on a light receiving surface side of the first chip, the solid state imaging device further comprising a wiring layer provided on an opposite side from said light receiving surface side in the first chip.

13. A camera system, comprising:
a first chip in which pixels are arranged in a form of a matrix; and
a second chip including a data processing circuit processing at least a pixel signal from the pixels,
wherein, the relation between the first chip and the second chip is stack configuration, and
wherein the camera system further comprises:
an XY address controller disposed in the first chip to address the pixels by selectively turning on a transistor provided in each pixel;
an analog-to-digital conversion circuit provided for each pixel in the first chip, the analog-to-digital conversion circuit provided on an opposite side from said light receiving surface side in the first chip; and
a buffer unit disposed on the opposite side of the first chip, and outside of the analog-to-digital conversion circuit, the buffer unit being connected, at one end, to an output of the analog-to-digital conversion circuit for each pixel in the first chip, and being connected, at another end, to one of a first plurality of output terminals provided on the opposite side of the first chip, the first plurality of outer terminals of the first chip connecting to a second plurality of output terminals provided on the second chip.

14. The camera system of claim 13, wherein the data processing circuit includes at least one storing unit to store a digital signal corresponding to the pixel signal.

15. The camera system of claim 13, wherein the analog-to-digital conversion circuit converts an analog signal from each of the pixels to a digital signal.

16. The camera system of claim 13, wherein the data processing circuit includes a multiplexer to combine a plurality of pixel signals from the pixel matrix.

17. The camera system of claim 13, further comprising a control unit disposed in the second chip to control the data processing circuit.

18. The solid state imaging device of claim 12,
wherein the wiring layer provided on the opposite side from said light receiving surface side in the first chip is configured to provide wiring for the analog-to-digital conversion circuit provided for each pixel.

19. The camera system of claim 13,
wherein the first chip further includes a wiring layer provided on the opposite side from said light receiving surface side in the first chip and configured to provide wiring for the analog-to-digital conversion circuit provided for each pixel.

* * * * *